(12) United States Patent
Mantiply et al.

(10) Patent No.: US 8,803,003 B2
(45) Date of Patent: Aug. 12, 2014

(54) DELTA ARRANGEMENT OF HEXAGONAL-CLOSE-PACKED SIGNAL PAIRS

(75) Inventors: Paul L. Mantiply, Mountain View, CA (US); Straty Argyrakis, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 180 days.

(21) Appl. No.: 13/525,531

(22) Filed: Jun. 18, 2012

(65) Prior Publication Data

US 2013/0333933 A1      Dec. 19, 2013

(51) Int. Cl.
*H05K 1/11*      (2006.01)
(52) U.S. Cl.
USPC ....... 174/261; 174/262; 361/785; 439/607.07
(58) Field of Classification Search
USPC ................. 174/250, 255, 261, 262, 264–266; 361/784, 785, 786, 803, 805, 807; 439/607.07, 607.09; 257/690, 698

See application file for complete search history.

(56) References Cited

U.S. PATENT DOCUMENTS

| | | | |
|---|---|---|---|
| 6,863,549 B2 * | 3/2005 | Brunker et al. | 439/108 |
| 7,217,889 B1 | 5/2007 | Parameswaran et al. | |
| 7,633,766 B2 * | 12/2009 | Regnier et al. | 361/777 |
| 7,939,930 B2 * | 5/2011 | Chen et al. | 257/690 |
| 2012/0309233 A1 * | 12/2012 | O'Malley et al. | 439/626 |

* cited by examiner

*Primary Examiner* — Hoa C Nguyen
(74) *Attorney, Agent, or Firm* — Edell, Shapiro & Finnan, LLC

(57) ABSTRACT

A circuit board is provided which includes a plurality of signal pairs of connectors. The signal pairs of connectors are disposed in a triangular grouping of three signal pairs of connectors such that a first connector of each signal pair is located at a vertex of the triangular grouping. A second connector of each signal pair is located at a side of the triangular grouping adjacent to the vertex of the first connector. The signal pairs may be differential pairs.

23 Claims, 7 Drawing Sheets

US 8,803,003 B2

DELTA ARRANGEMENT OF HEXAGONAL-CLOSE-PACKED SIGNAL PAIRS

TECHNICAL FIELD

The present disclosure relates to integrated circuits and printed circuit boards, and more specifically to the connectors arranged on integrated circuits and printed circuit boards.

BACKGROUND

Printed circuit board (PCB), integrated circuit (IC) and integrated circuit package substrate (IC package) design is becoming increasingly complex due to a variety of factors. Such factors include increasing data rates of signals conveyed by PCBs, increasing numbers of I/O circuits disposed in an IC, decreasing sizes of circuits, increased density of circuits in PCBs, ICs and IC Packages, numerous layers in the PCBs, and increased PCB thickness. Many of these factors lead to increased density of connectors, such as vias, pins and traces, within and between PCBs, ICs and IC Packages.

As the density and signal rates of PCB, IC and IC Package elements increase, elements of the PCBs, ICs and IC Packages experience increased crosstalk. Generally, crosstalk can occur when signals being routed by neighboring circuit elements interfere with each other. Crosstalk can lead to increased signal noise, which in turn, can make it more difficult for a receiver to correctly interpret a signal or for other circuits on the IC to perform their desired functions.

Previous attempts to limit crosstalk have relied on isolating neighboring elements from each other through physical separation, or through the use of virtual grounding planes. As the density of elements on PCBs, ICs and IC Packages increases, it becomes more difficult to prevent crosstalk through these mechanisms.

DESCRIPTION OF EXAMPLE EMBODIMENTS

Overview

According to embodiments set forth herein, a circuit board is provided which includes a plurality of signal pairs of connectors. The signal pairs of connectors are disposed in a triangular grouping of three signal pairs of connectors such that a first connector of each signal pair is located at a vertex of the triangular grouping. A second connector of each signal pair is located at a side of the triangular grouping adjacent to the vertex of the first connector.

Example Embodiments

Figure 1:
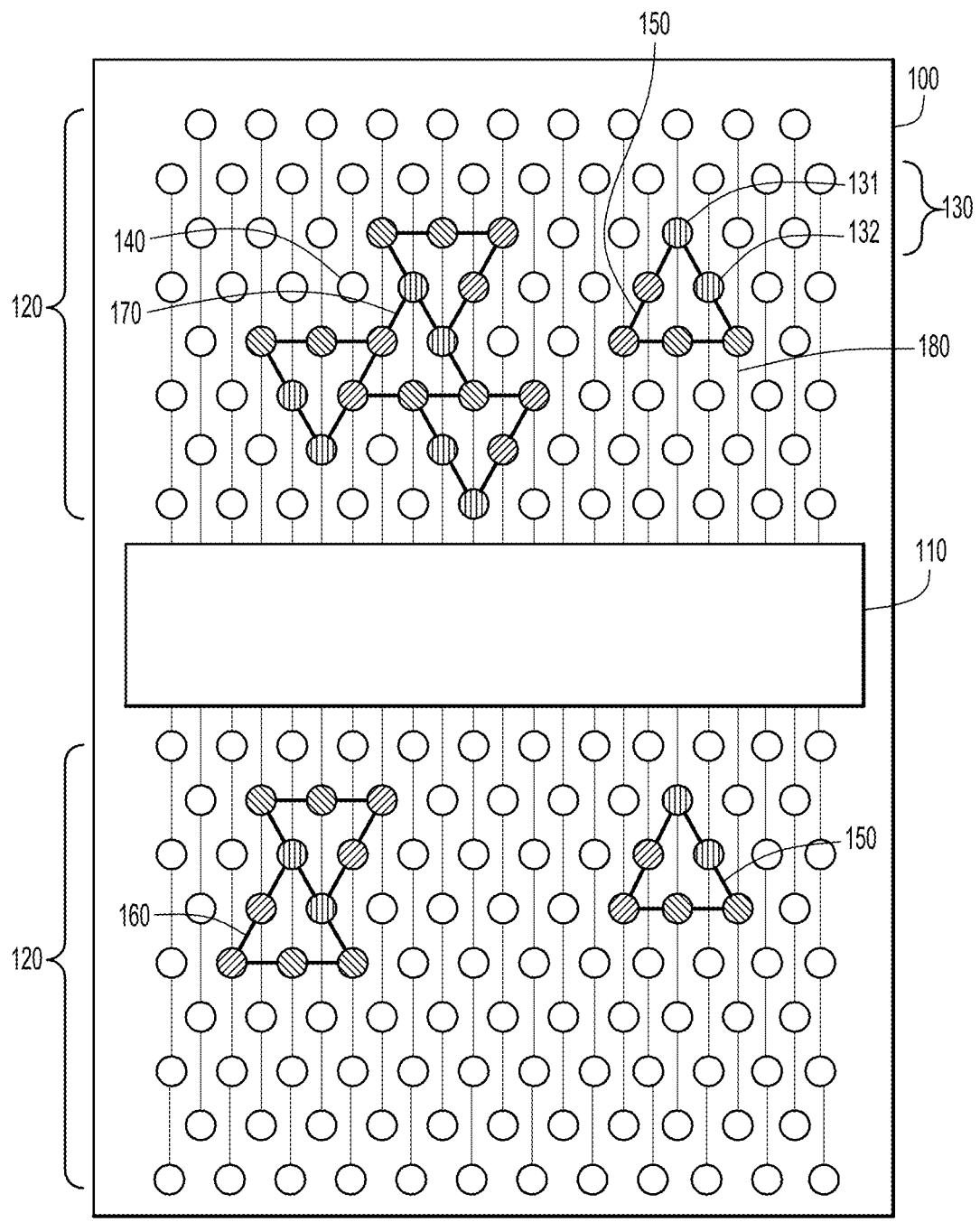
FIG. 1 illustrates an example PCB including triangular groupings of signal pairs arranged within a hexagonal array of connectors and grounding pins.

Reference is made to FIG. 1. FIG. 1 is an example circuit board 100. Arranged on the circuit board 100 are circuit elements 110 and hexagonal arrays 120 of connectors and/or pins. The arrays 120 may include signal pairs of connectors 130, as well as grounding connectors or pins 140 (ground elements in general). Each signal pair of connectors 130 comprises a first connector 131 and a second connector 132. The signal pairs of connectors 130 may take the form of pins, packed arrays of vias, ball grid arrays, and other IC and PCB elements and components known to those skilled in the art.

Arranged within the hexagonal arrays 110 are triangular (or delta-shaped) groupings 150 of signal pairs of connectors 130. The triangular groupings 150 can be single triangular groupings 150, nested groupings 160, and fully nested groupings 170, as described in more detail hereinafter with reference to FIGS. 2-5. Traces 180 may connect each connector 131, 132 to other IC and PCB components included on circuit board 100, or to other components external to circuit board 100.

Figure 2:
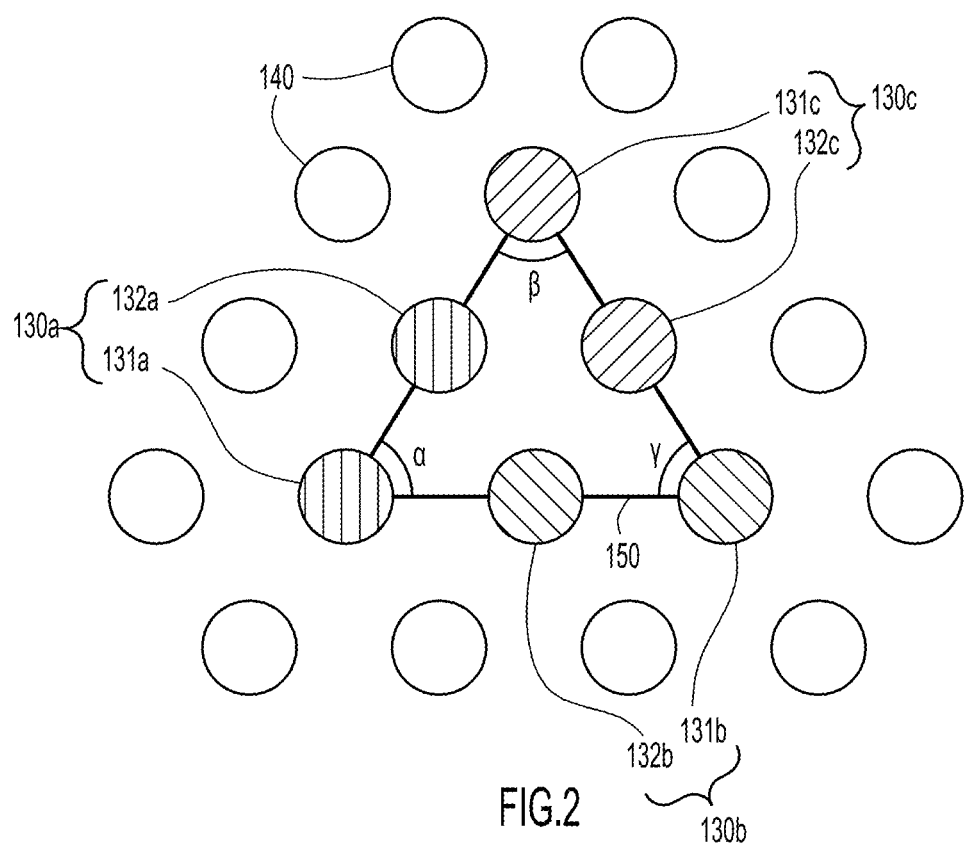
FIG. 2 illustrates an example of a single triangular grouping of signal pairs.

Reference is now made to FIG. 2. Depicted in FIG. 2 is a triangular grouping 150 of signal pairs 130a-c. Each signal pair 130a-c is comprised of a first connector 131a-c and a second connector 132a-c. As depicted, triangular grouping 150 is formed by placing the three signal pairs 130a-c such that a first connector 131a-c of each signal pair is arranged at a vertex of the triangular grouping, and each second connector 132a-c is arranged at a side of the triangular grouping 150 adjacent to the vertex of first connector 131a-c. In other words, each signal pair of connectors 130a-c defines a side of the triangular grouping 150, with the first connector 131a-c of each signal pair arranged at the vertex of triangular grouping 150, and the second connector 132a-c arranged on the side.

In one example form, the triangular grouping 150 can be an equilateral triangular grouping. That is, the distance between the first connectors 131a-c is the same for all of the first connectors 131a-c. In other words, the angle between adjacent signal pairs 130a-c is sixty degrees. For example, if a line is used to connect the connectors of a signal pair, the angle between the line connecting the connectors of a first signal pair, and the line connecting the connectors of a second signal pair would be substantially 60°. Specifically, the angle α between signal pair 130a and signal pair 130b is substantially 60°. Similarly, the angle β between signal pair 130a and 103c, and the angle γ between signal pairs 130b and 130c are both substantially 60°.

According to further examples, the second connectors 132a-c are located at the midpoint of the side on which they are located. For example, the distance between first connector 131a and second connector 132a is substantially the same as the distance between second connector 132a and first connector 131b. According to this example, second connectors 132a and 132b would be similarly located at the midpoints of their respective sides.

In a further example, the triangular grouping 150 may be surrounded by a hexagonal grouping of grounding elements or pins 140. In such a grouping, each connector 131a-c, 132a-c is located within proximity to numerous grounding pins 140. In other words, the triangular grouping 150 is substantially, and in some cases entirely, surrounded by ground pins 140. Additionally, the surrounding grounding pins 140 may serve to isolate triangular grouping 150 from other IC and PCB elements, as well as from additional triangular groupings.

Figure 3:
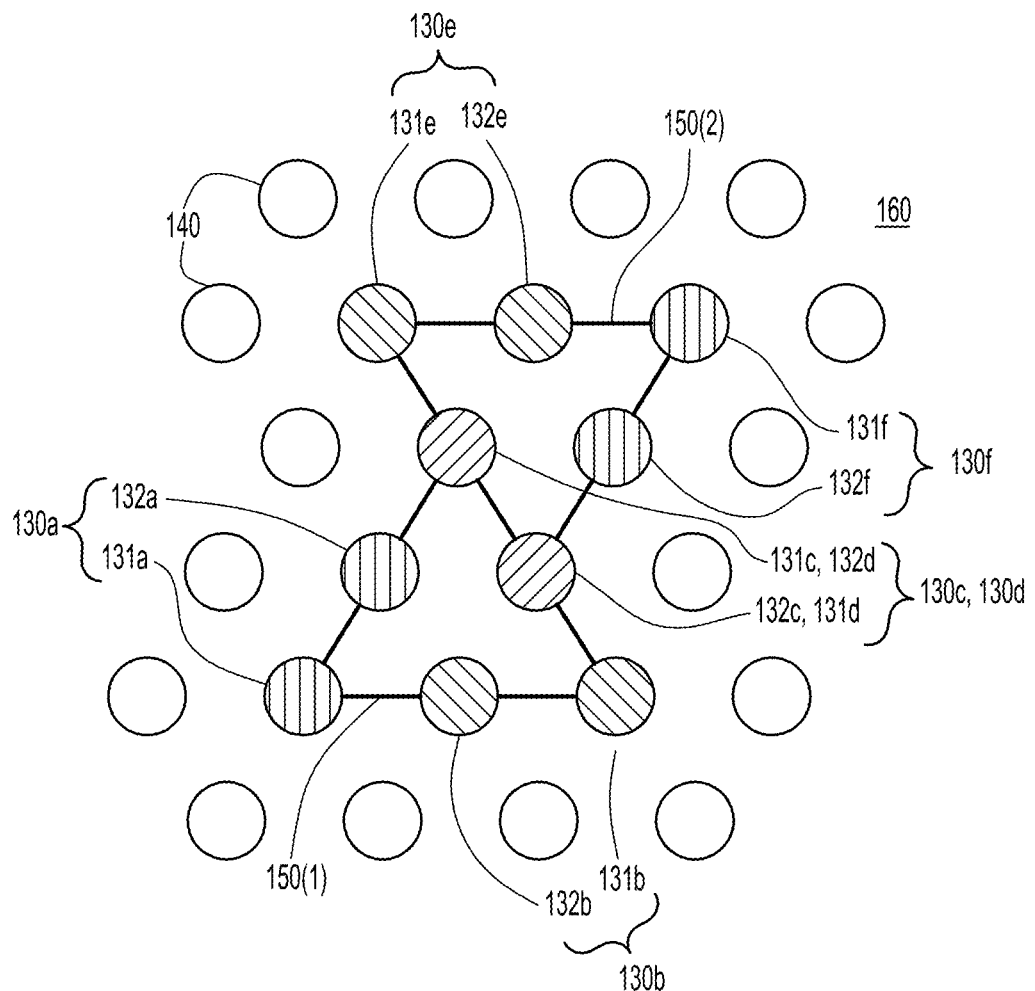
FIG. 3 illustrates an example of two nested triangular groupings of signal pairs.

Referring now to FIG. 3, an example is shown of two nested triangular groupings 150(1) and 150(2) of signal pairs 130a-e forming nested grouping 160. Grouping 150(1) is comprised of signal pairs 130a-130b and grouping 150(2) is comprised of signal pairs 130d-130f. Both triangular groupings 150(1) and 150(2) are similar to the example triangular grouping described above in connection with FIG. 1. Each first connector 131a-f of each signal pair is arranged at a vertex of its respective triangular grouping 150(1)/150(2), and each second connector 132a-f is arranged at a side of its respective triangular grouping 150(1)/150(2) adjacent to the vertex of first connector 131af.

The example of FIG. 3 depicts nesting of triangular groupings 150(1) and 150(2). The nesting is accomplished by arranging signal pair 130c,130d as being in common to (shared by) both of triangular groupings 150(1) and 150(2). Specifically, first connector 131c is placed at a vertex of triangular grouping 150(1) while simultaneously serving as second connector 132d which is located at a side of triangular grouping 150(2). Similarly, first connector 131d is placed at a vertex of triangular grouping 150(2) while simultaneously serving as second connector 132c which is located at a side of triangular grouping 150(2). In other words, triangular groupings 150(1) and 150(2) are nested through their sharing of signal pair 130c,130d.

By nesting triangular groupings 150(1) and 150(2) as described above, a grouping can be created which is comprised of a first triangular grouping 150(1) nested with triangular grouping 150(2), where triangular grouping 150(2) has an inverted orientation with respect to triangular grouping 150(1). By nesting the triangular groupings in this way, a high density of signal pairs can be achieved. Additionally, by surrounding nested triangular groupings 150(1)/150(2) with grounding pins 140, it is possible to isolate nested triangular groupings 150(1)/150(2) from other IC and PCB elements, as well as from additional triangular groupings and other nested triangular groupings.

As with the example depicted in FIG. 2, triangular groupings 150(1) and 150(2) can be arranged as equilateral triangular groupings. Additionally, triangular groupings 150(1) and 150(2) can be arranged such that each second connector 132a-f is at a midpoint of its respective side.

Figure 4:
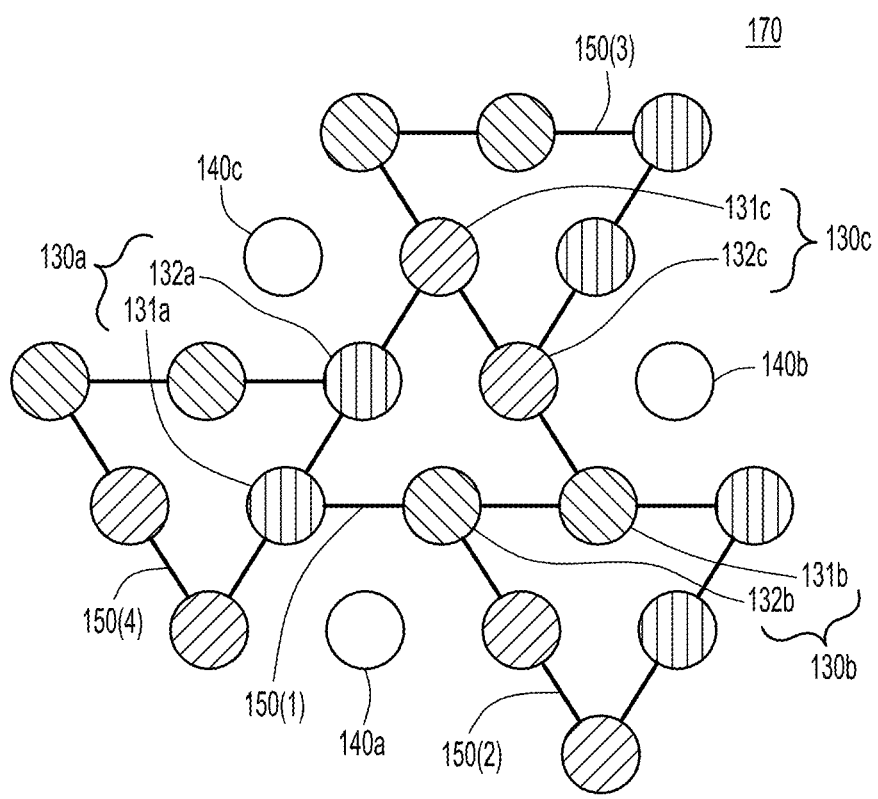
FIG. 4 illustrates an example of a fully-nested grouping of signal pairs.

Referring now to FIG. 4, a fully nested grouping 170 is described. In this example, triangular groupings 150(1)-150(4) are arranged to form fully nested grouping 170 in that signal pairs of one central triangular grouping are shared with several other adjacent triangular groupings. Specifically, triangular grouping 150(1) is nested with each of triangular groupings 150(2)-150(4). Each signal pair of triangular grouping 150(1) is nested with another of triangular groupings 150(2)-150(4). For example, signal pair 130a is nested with triangular groupings 150(1) and 150(4). Signal pair 130b is nested with triangular groupings 150(1) and 150(3), and signal pair 130c is nested with triangular grouping 150(1) and 150(3).

Furthermore, when the triangular groupings are arranged within a hexagonal array of elements, each connector of triangular grouping 150(1) can have perfect symmetry with respect to ground. For example, if the hexagonal array of elements depicted in FIG. 4 are arranged such that the distances between each element are the same, each connector of triangular grouping 150(1) is symmetric with respect to ground. Specifically, the distances from first connector 131a and second connector 132b to grounding pin 140a are the same as the distances from first connector 131b and second connector 132c to grounding pin 140b, as are the distances from first connector 131c and second connector 132a to grounding pin 140c.

Figure 5:
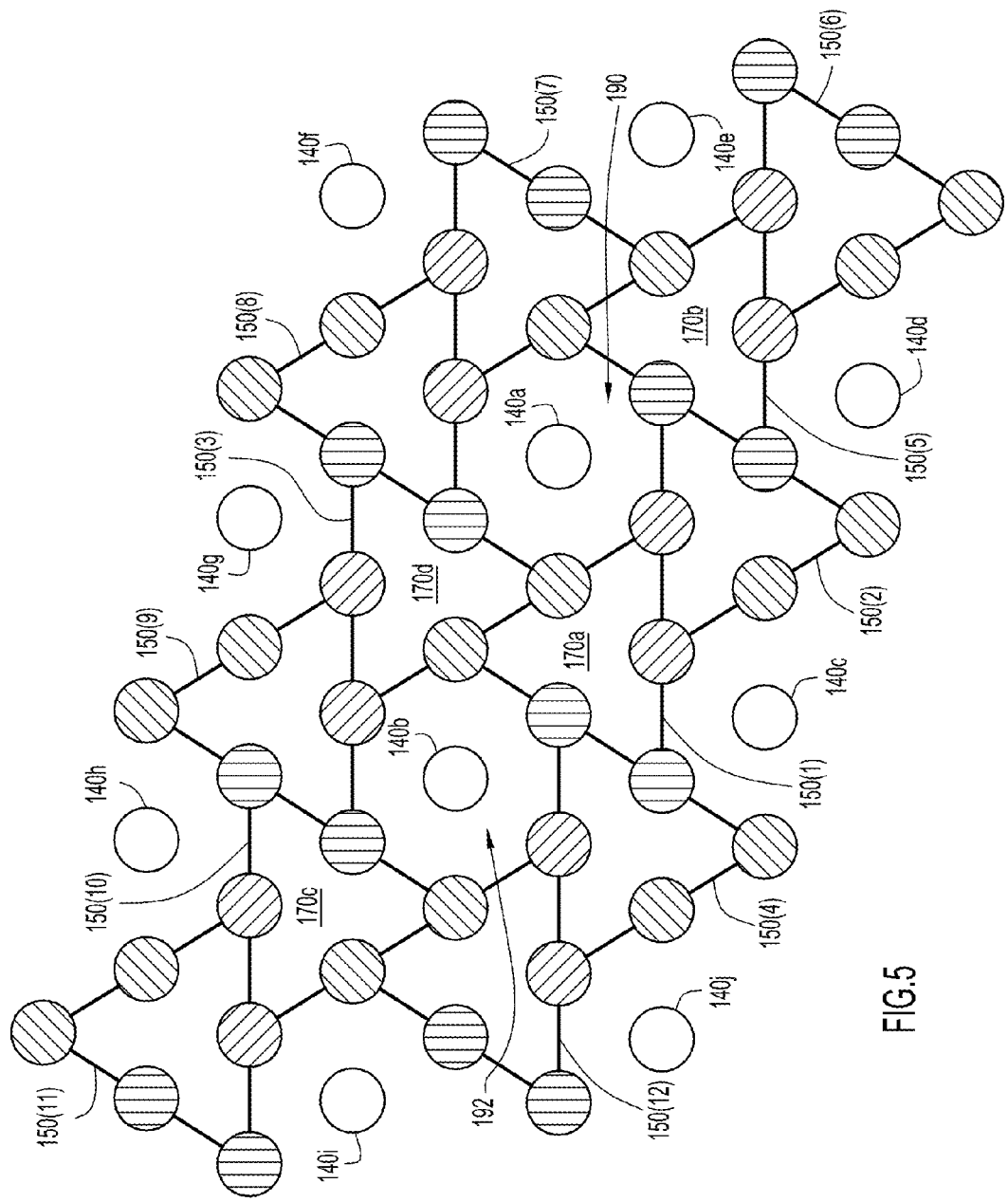
FIG. 5 illustrates a plurality of fully nested groupings of signal pairs.

Referring now to FIG. 5, depicted therein are triangular groupings 150(1)-150(12) arranged to form four fully nested groupings 170a-d. Specifically, fully nested grouping 170a is comprised of triangular groupings 150(1)-150(4), while fully nested grouping 170b is comprised of triangular groupings 150(2), and 150(5)-150(7). Fully nested grouping 170c is comprised of triangular groupings 150(9)-150(12). Finally, fully nested grouping 170d is comprised of triangular groupings 150(1), 150(3), 150(8) and 150(9).

In addition to the fully nested groupings 170a-d, it can be seen that pairs of adjacent triangular groupings form nested groupings as described above with reference to FIG. 3. For example, it can be seen that triangular grouping 150(1) and triangular grouping 150(2) form a nested grouping. Similarly, triangular grouping 150(2) and triangular grouping 150(5) also form a nested grouping, as do triangular groupings 150(5) and 150(6), as well as many others.

Another way to view the plurality of fully nested groupings 170a-d is that six triangular groupings form a repeating (tile) pattern around hexagonal center portions 190 and 192. For example, hexagonal center portion 190 is surrounded by triangular groupings 150(1), 150(2), 150(3), 150(5), 150(7) and 150(8). Similarly, hexagonal center portion 192 is surrounded by triangular groupings 150(1), 150(3), 150(4), 150(9), 150(10) and 150(12). According to example embodiments, a grounding pin 140a may be located within hexagonal center portion 190 and a grounding pin 140b may be located within hexagonal center portion 192, providing symmetrical grounding to each connector. As illustrated in FIG. 5, a connector is located at each vertex of hexagonal center portions 190 and 192. As further illustrated, two connectors of each of triangular groupings 150(1), 150(2), 150(3), 150(5), 150(7) and 150(8) form the vertices of hexagonal center portion 190, though each of the two connectors is from a different signal pair.

By combining fully nested groupings 170a-d with grounding pins 140a-j in the arrangement shown in FIG. 5, it is possible to provide a dense arrangement of connectors that is perfectly symmetrical with respect to ground. For example, in the fully nested grouping 170a, the distance from each connector of fully nested grouping 170a to a nearest grounding pin 140a-g is the same for every connector in fully nested grouping 170a.

The fully nested groupings 170a-d are not limited to nesting only four fully nested groupings. Instead, a repeating pattern, or tessellation (tile pattern), of many fully nested groupings can be created. Tiling multiple fully nested groupings results in a repeating pattern of triangular groupings and hexagonal center portions. If a grounding pin is placed within each hexagonal portion, it is possible to form a hexagonal arrangement of signal connectors and grounding pins such that every signal connector is perfectly symmetrical with regards to ground. Grounds are placed in a manner that provides perfect symmetry to all pairs in the grouping. This structure can be tiled indefinitely to provide a 6:1 signal to ground ratio with noise cancellation superior to a 2:1 signal to noise ratio array with a traditional parallel pattern.

Figure 6:
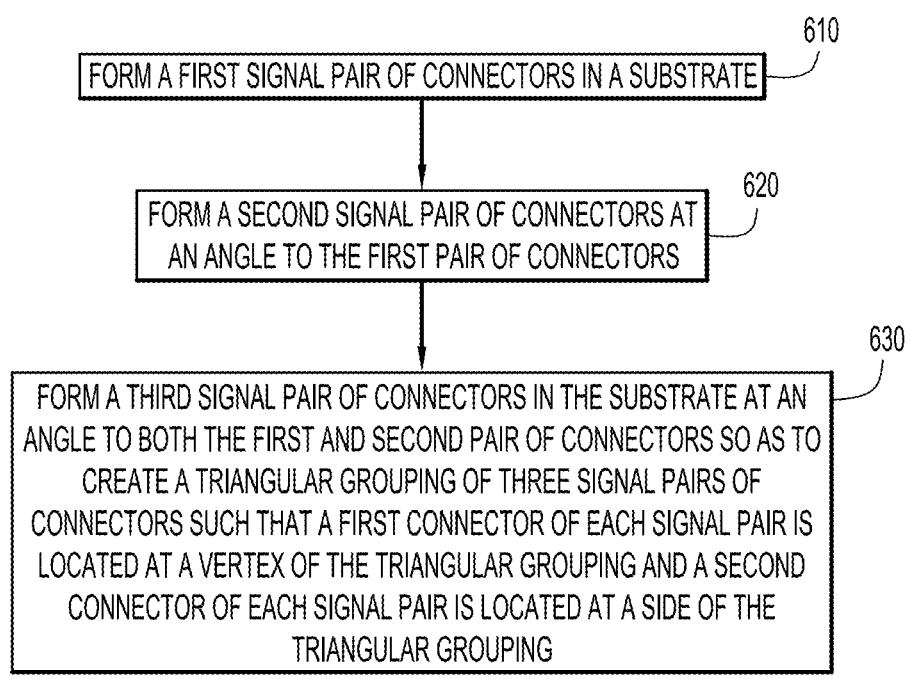
FIG. 6 is a flowchart illustrating an example method of arranging signal pairs into triangular groupings.

Illustrated in FIG. 6 is a flow chart for a method for constructing a PCB with the signal pair groupings described above in connection with FIGS. 1-5. At step 610, a first signal pair of connectors is formed in a substrate of a PCB. At step 620, a second signal pair of connectors is formed in the substrate at an angle to the first signal pair of connectors.

According to various examples, the angle between the first and second signal pairs of connectors can be measured by measuring an angle between a line connecting the connectors of the first signal pairs and a line connecting the connectors of the second signal pair, as described above.

At step 630, a third signal pair of connectors is formed in the substrate. The third signal pair is formed at an angle to the first signal pair and the second signal pair such that the first, second and third signal pairs create a triangular grouping of signal pairs of connectors. Specifically, the triangular grouping of signal pairs is formed such that a first connector of each signal pair is formed at vertex of the triangular grouping, and a second connector of each signal pair is formed at a side of the triangular grouping.

The first, second and third signal pairs can be arranged such that the angles between the signal pairs are substantially 60°. According to further examples, two or more nested triangular groupings of signal connectors may be formed such that a signal pair shared between adjacent triangular groupings is located a vertex of a first triangular grouping that corresponds to a side of the second triangular grouping, and a second connector of the shared signal pair is located at a side of the first triangular grouping that corresponds to vertex of the second triangular grouping.

Figure 7:
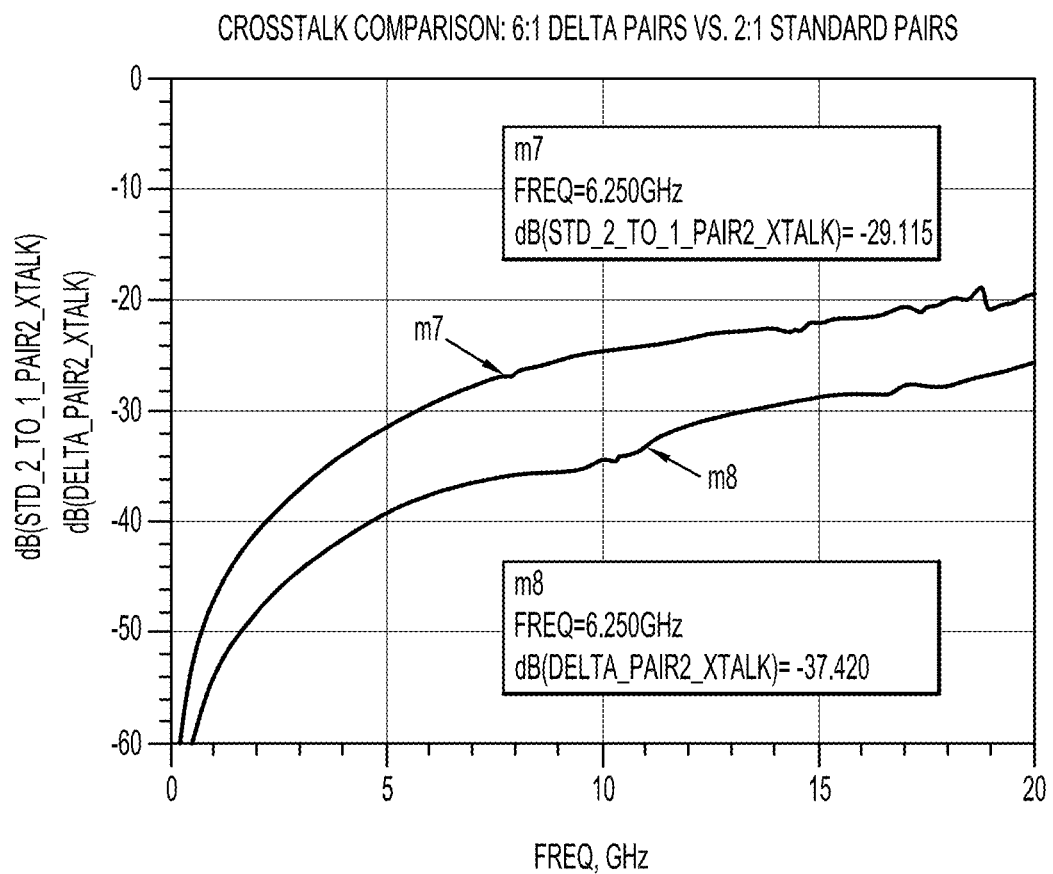
FIG. 7 is illustrates plots of crosstalk for various signal pair groupings and showing the crosstalk improvement achieved by the groupings described herein.

Reference is now made to FIG. 7. FIG. 7 illustrates that the examples described herein may exhibit natural electromagnetic noise rejection of signal mode cross-talk and reduced signal to common mode-conversion. FIG. 7 illustrates a comparison of the cross-talk between a traditional arrangement pair of connectors, and a pair of connectors arranged within a triangular grouping of connectors according to the examples described herein. In the specific example depicted in FIG. 7, the pairs of connectors are differential pairs of connectors. As can be seen in FIG. 7, at 6.250 GHz the differential pair arranged within the triangular grouping of signal pairs shows an improvement of over 8 dB as compared to a standard differential pair.

Reference is now made back to FIG. 2. The reduction in cross-talk can be due to natural electromagnetic noise rejection in triangular groupings of signal pairs. For example, a triangular grouping may be created in which the electromagnetic fields produced by a signal pair is substantially lessened at the location of another connector of the triangular grouping. According to an example as depicted in FIG. 1, it is possible that second connector 132a will receive zero net cross talk from the electric fields produced by the connectors of differential signal pair 130c. Specifically, if a differential signal is being sent through signal pair 130c, the electric fields caused by first connector 131c and second connector 132c will substantially cancel at points equidistant from both first connector 131c and second connector 132c. By varying the difference in distance between second connector 132a and each of the connectors of signal pair 130c, a triangular grouping can be chosen with a suitable cancellation of the electric fields caused by first connector 131c and second connector 132c.

Similarly, second connector 132b can be positioned such that there is sufficient cancellation of the electric fields caused by a differential pair 130a, and second connector 132c can be positions such there is sufficient cancellation of the electric fields caused by differential pair 130b.

Additionally, triangular groupings of signal pairs can be chosen which will result in substantial cancellation of the magnetic fields caused by a differential pair of connectors. For example, in the triangular grouping of FIG. 2, the magnetic field caused by first differential connector 131c will cancel a portion of the magnetic field caused by second differential connector 132c. The amount of cancellation of the magnetic fields is a function of both the distance and angle of a position relative to first connector 131c and second connector 132c. For example, it may be desirable to position second connector 132a at a position where the magnetic fields caused by first connector 131c and second connector 132c completely cancel. Accordingly, second connector 132a may be positioned such that it is equidistant from first connector 131c and second connector 132c, and the angle formed from first connector 131c to second connector 132a to second connector 132c is 90°. By changing this angle and distance, a desired amount of cancellation of the magnetic fields caused by first connector 131c and second connector 132c can be achieved.

Similarly, second connector 132b can be positioned such that there is sufficient cancellation of the magnetic fields caused by differential pair 130a, and second connector 132c can be positions such there is sufficient cancellation of the magnetic fields caused by differential pair 130b.

Furthermore, triangular groupings can be created which balance the need to provide a high density of signal pairs while providing sufficient cancellation of both electric and magnetic fields caused by each of the signals pairs. For example, if it is desired that each second connector of a triangular grouping receives substantially perfect cancellation of the electric fields and substantial cancellation of the magnetic fields caused by an adjacent differential pair, an equilateral triangle arrangement may be formed such that the second connector of each differential pair is located at a midpoint of its respective side. In such an equilateral triangular grouping, each second connector would experience substantially perfect cancellation of the electric fields caused by an adjacent differential pair. While such an arrangement may not result in perfect cancellation of the magnetic fields as the determinative angle is 60° as opposed to 90°, each second connector would still see substantial cancellation of the magnetic fields caused by an adjacent differential pair.

The above description is intended by way of example only.

What is claimed is:

1. An apparatus comprising:
   a circuit board; and
   a plurality of signal pairs of connectors arranged on the circuit board, the signal pairs of connectors being disposed in a triangular grouping of three signal pairs of connectors such that a first connector of each signal pair is located at a vertex of the triangular grouping and a second connector of each signal pair is located at a side of the triangular grouping adjacent to the vertex of the first connector.

2. The apparatus of claim 1, wherein the signal pairs comprise differential pairs.

3. The apparatus of claim 1, wherein the triangular grouping is an equilateral triangular grouping, and the second connector of each signal pair is arranged at a midpoint of the side of the triangular grouping.

4. The apparatus of claim 1, wherein each signal pair of connectors has natural electromagnetic noise rejection of signal mode crosstalk and perfect symmetry with respect to ground to reduce signal to common mode conversion.

5. The apparatus of claim 1, wherein the triangular grouping is surrounded by a hexagonal array of ground elements and/or signal pairs.

6. The apparatus of claim 1, wherein the signal pairs of connectors comprise packed arrays of vias.

7. The apparatus of claim 1, wherein the signal pairs of connectors comprise ball grid arrays.

8. The apparatus of claim 1, wherein the signal pairs of connectors comprise pins.

9. The apparatus of claim 1, wherein the plurality of signal pairs are arranged in first and second adjacent triangular groupings that share a signal pair of connectors, a first connector of a shared signal pair of adjacent triangular groupings is located at a vertex of the first triangular grouping that corresponds to a side of the second triangular grouping and a second connector of the shared signal pair is located at a side of the first triangular grouping that corresponds to a vertex of the second triangular grouping.

10. The apparatus of claim 9, further comprising a plurality of grounding elements on the circuit board, wherein the first and second triangular groupings form a nested pair of triangular groupings and are at least partially surrounded by ground elements.

11. The apparatus of claim 1, wherein a plurality of triangular groupings of three signal pairs of connectors are arranged such that each signal pair is shared by a first triangular grouping and a second triangular grouping, and wherein a first connector of the shared signal pair is located at a vertex of the first triangular grouping that corresponds to a side of the second triangular grouping, and wherein a second connector of the shared signal pair is located at a side of the first triangular grouping that corresponds to a vertex of the second triangular grouping; and a plurality of ground elements disposed on the circuit board;

wherein a distance from each connector to a nearest ground element is substantially the same for all connectors.

12. The apparatus of claim 11, wherein one of the plurality of grounding elements is arranged within the plurality of triangular groupings and is the same distance from at least one connector of each signal pair of the plurality of triangular groupings.

13. The apparatus of claim 12, wherein the one of the plurality of grounding elements is arranged within six triangular groupings, and wherein the grounding element is equidistant to at least one connector of each of the six triangular groupings.

14. An apparatus comprising:

a circuit board; and a hexagonal array of grounding elements and signal pairs of connectors disposed on the circuit board;

wherein a grounding element is positioned within six triangular groupings, each of the six triangular groupings comprising three signal pairs of connectors arranged on the circuit board, the three signal pairs of connectors being disposed such that a first connector of each of the three signal pairs is located at a vertex of the triangular grouping and a second connector of each of the three signal pair is located at a side of the triangular grouping adjacent to the vertex of the first connector; and wherein two signal pairs of connectors of each of the six triangular groupings is common to a first and second of the six triangular groupings, and wherein each connector of the two signal pairs is positioned at a vertex of the first triangular grouping and positioned at a side of the second triangular grouping.

15. The apparatus of claim 14, wherein the grounding element is equidistant to at least one connector of each of the triangular groupings.

16. The apparatus of claim 14, wherein each of the six triangular groupings is an equilateral triangular grouping, and the second connector of each signal pair is arranged at a midpoint of the side of the triangular grouping.

17. The apparatus of claim 14, wherein the grounding element is positioned within a hexagonal center portion between the six triangular groupings, and wherein at least two connectors from two different signal pairs of each of the six triangular groupings is located at a vertex of the hexagonal center portion.

18. A method comprising:

forming a first signal pair of connectors in a substrate;

forming a second signal pair of connectors in the substrate at a first angle to the second signal pair; and forming a third signal pair at a second angle to the first signal pair and a third angle to the second signal pair so as to create a triangular grouping of the first second and third signal pairs such that a first connector of each signal pair is located at a vertex of the triangular grouping and a second connector of each signal pair is located at a side of the triangular grouping.

19. The method of claim 18, wherein forming the first, second and third signal pairs comprises forming differential pairs of connectors.

20. The method of claim 18, wherein the angle between the first signal pair and the second signal pair is substantially 60 degrees, wherein the angle between the second signal pair and the third signal pair is substantially 60 degrees, and wherein the angle between the first signal pair and the third signal pair is substantially 60 degrees.

21. The method of claim 20, where the second connector of each signal pair is arranged at a mid-point of the side of the triangular grouping.

22. The method of claim 18, further comprising forming the first, second and third signal pairs of connectors within a hexagonal array of ground elements and/or signals pairs.

23. The method of claim 18, further comprising forming a plurality of adjacent triangular groupings such that a first connector of a shared signal pair of adjacent triangular groupings is located at a vertex of a first triangular grouping that corresponds to a side of a second triangular grouping and a second connector of the shared signal pair is located at a side of the first triangular grouping that corresponds to a vertex of the second triangular grouping.

* * * * *